United States Patent
Topacio et al.

(10) Patent No.: US 7,670,939 B2
(45) Date of Patent: Mar. 2, 2010

(54) SEMICONDUCTOR CHIP BUMP CONNECTION APPARATUS AND METHOD

(75) Inventors: Roden R. Topacio, Markham (CA); Vincent Chan, Richmond Hill (CA); Fan Yeung, Irvine, CA (US)

(73) Assignee: ATI Technologies ULC, Markham, Ontario (CA)

(*) Notice: Subject to any disclaimer, the term of this patent is extended or adjusted under 35 U.S.C. 154(b) by 0 days.

(21) Appl. No.: 12/119,174

(22) Filed: May 12, 2008

(65) Prior Publication Data

US 2009/0278264 A1   Nov. 12, 2009

(51) Int. Cl.
*H01L 21/44* (2006.01)
(52) U.S. Cl. .............. 438/612; 438/706; 257/E21.006; 257/E21.079; 257/E21.499; 257/E21.509
(58) Field of Classification Search ................ 438/106, 438/110, 121, 612, 613, 614, 617, 685, 686, 438/687
See application file for complete search history.

(56) References Cited

U.S. PATENT DOCUMENTS

| 5,471,090 | A | 11/1995 | Deutsch et al. |
| 5,706,178 | A | 1/1998 | Barrow |
| 5,759,910 | A | 6/1998 | Mangold et al. |
| 5,859,474 | A | 1/1999 | Dordi |
| 6,913,948 | B2 | 7/2005 | Caletka et al. |
| 7,335,995 | B2 * | 2/2008 | Pflughaupt et al. .......... 257/779 |
| 7,339,275 | B2 * | 3/2008 | Wang et al. ................. 257/777 |
| 2005/0023327 | A1 | 2/2005 | Pendse |
| 2005/0189622 | A1 * | 9/2005 | Humpston et al. .......... 257/659 |

* cited by examiner

*Primary Examiner*—David Nhu
(74) *Attorney, Agent, or Firm*—Timothy M. Honeycutt

(57) ABSTRACT

Various semiconductor chip packages and methods of making the same are disclosed. In one aspect, a method of manufacturing is provided that includes coupling a solder bump to a side of a semiconductor chip and bringing the solder bump into contact with a conductor pad coupled to a substrate and positioned in an opening of a solder mask on the substrate. The conductor pad has a first lateral dimension and the opening has a second lateral dimension that is larger than the first lateral dimension. A metallurgical bond is established between the solder bump and the conductor pad.

16 Claims, 5 Drawing Sheets

SEMICONDUCTOR CHIP BUMP CONNECTION APPARATUS AND METHOD

BACKGROUND OF THE INVENTION

1. Field of the Invention

This invention relates generally to semiconductor processing, and more particularly to methods and apparatus for electrically connecting a semiconductor chip to a package substrate.

2. Description of the Related Art

Many present day semiconductor chips are mounted to a package substrate that is, in-turn, mounted to another printed circuit board. A package substrate is typically larger in size than its companion chip. A package substrate serves several purposes. In one aspect, a package substrate provides a convenient interface between a typically small semiconductor chip and a normally much larger printed circuit board. In another aspect, a package substrate provides a mounting surface and conductive pathways for a variety of passive components, such as capacitors, that are useful for the operation of but cannot be easily incorporated into a semiconductor chip.

In order to serve as an interface between a semiconductor chip and a printed circuit board, a typical package substrate includes a collection of conductor lines that may be interspersed in several different layers of insulating material. A variety of schemes are used to link the substrate conductor lines to a printed circuit board. Pins, solder balls and land pads are examples of structures used to connect to a printed circuit board. Similarly, a variety of techniques are used to electrically connect a semiconductor chip to the conductor lines of a package substrate. Two such techniques are bond line connections and flip-chip solder bump connections.

In one conventional flip-chip solder bump design, a package substrate includes a mounting surface that is destined to receive a semiconductor chip. The mounting surface includes a collection of conductive bump pads and component pads. A solder mask is formed on the mounting surface and patterned lithographically with a series of openings that lead to the bump pads and the component pads. The openings leading to the bumps pads are patterned with a lateral dimension that is smaller than the lateral dimension of the bump pad. In one conventional design, the bump pads have a round footprint. In another conventional design, the bumps pads have a rectangular footprint. A solder stencil is next placed on the solder mask. The solder stencil has an array of openings that line up vertically with the collection of openings in the solder mask. Solder is pressed into the openings and the stencil is removed. To provide the solder structures present in the bump pad openings with an improved and consistent shape, a coining operation is performed. The coined solder structures are often referred to as a "pre-solders". Conventional pre-solders are typically composed of low temperature melting point solders, such as tin-lead eutectics.

To interface with the pre-solders of the package substrate, the semiconductor chip is provided with a group of solder bumps. Some conventional chip solder bumps are composed of high lead content lead-tin solder. To form the solder bumps in such cases, a high lead content lead-tin solder is deposited on conductive bump pads of the semiconductor chip. The semiconductor chip (usually at the wafer stage) is next heated to a high enough temperature to reflow the solder bumps. The wafer is subsequently diced into individual chips. A given individual chip is seated on a package substrate so that the solder bumps of the chip are brought into contact with the pre-solders of the package substrate and a reflow is performed to merge the solder bumps and pre-forms into conductive pillars. The metallurgical bonding between the high lead content tin-lead solder bumps and the pre-solders is not the result of the melting and wetting of both the low melting point eutectic pre-solders and the high melting point solder bumps. Rather, the reflow is performed at a little above the melting point of the eutectic pre-solders but well below the melting point of the high lead content solder bumps such that the metallurgical bonding is due to pre-solder liquification and wetting to the solid phase solder bumps. Thus, by using eutectic pre-solders, the substrate need not be subjected to potentially damaging high temperatures that would be necessary to melt the high lead content tin-lead bumps.

The foregoing conventional pre-solder design has been successfully used on a number of package designs. However, the materials, tools and processing time required to form an array of pre-solders do represent cost items that add to the overall cost of producing a packaged semiconductor chip.

The present invention is directed to overcoming or reducing the effects of one or more of the foregoing disadvantages.

SUMMARY OF THE INVENTION

In accordance with one aspect of the present invention, a method of manufacturing is provided that includes coupling a solder bump to a side of a semiconductor chip and bringing the solder bump into contact with a conductor pad coupled to a substrate and positioned in an opening of a solder mask on the substrate. The conductor pad has a first lateral dimension and the opening has a second lateral dimension that is larger than the first lateral dimension. A metallurgical bond is established between the solder bump and the conductor pad.

In accordance with another aspect of the present invention, a method of manufacturing is provided that includes forming plural conductor pads on a package substrate. Each of the conductor pads has a first lateral dimension. A solder mask is formed on the package substrate with plural openings that expose upper portions of each of the plural conductor pads. Each of the plural openings has a second lateral dimension that is larger than the first lateral dimension. Plural solder bumps are coupled to a side of a semiconductor chip. Each of the plural solder bumps is brought into contact with a corresponding conductor pad. A metallurgical bond is established between each of the plural solder bumps and each of the corresponding plural conductor pads.

In accordance with another aspect of the present invention, an apparatus is provided that includes a package substrate that has a first side and plural conductor pads on the first side. Each of the plural conductor pads has a first lateral dimension. A solder mask is positioned on the first side of the substrate and has an opening co-located with each of the plural conductor pads. Each of the openings has a second lateral dimension that is larger than the first lateral dimension. A semiconductor chip that has plural solder bumps coupled to a first side thereof is provided. Each of the plural solder bumps is metallurgically bonded to one of the plural conductor pads without an intervening conductor structure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
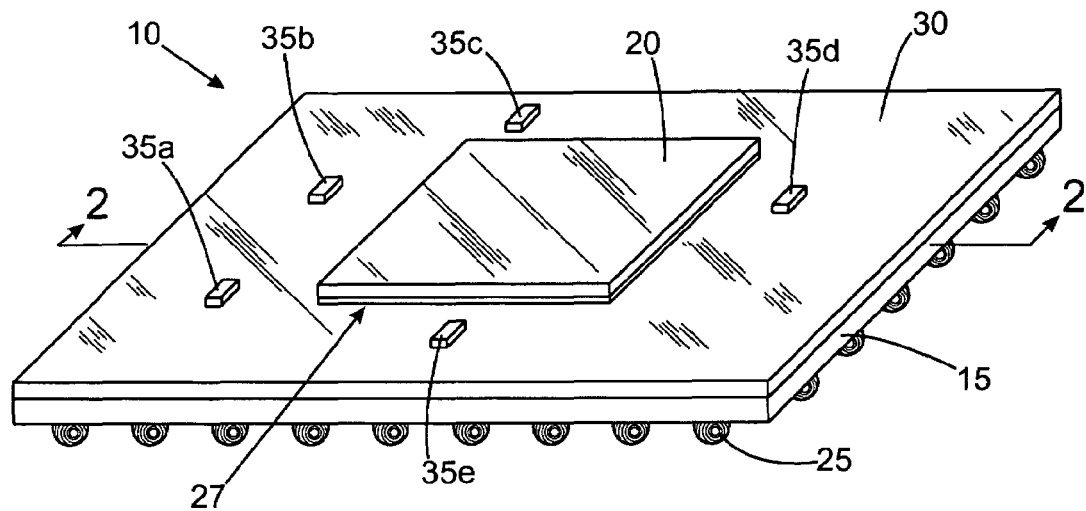
FIG. 1 is a pictorial view of an exemplary embodiment of a semiconductor chip package that includes a substrate adapted to receive one or more semiconductor chips or dice.

In the drawings described below, reference numerals are generally repeated where identical elements appear in more than one figure. Turning now to the drawings, and in particular to FIG. 1, therein is shown a pictorial view of an exemplary embodiment of a semiconductor chip package 10 that includes a substrate 15 adapted to receive a semiconductor chip or die 20 or multiple chips if desired. The chip 20 is flip-chip mounted to the substrate 15 and electrically connected thereto by way of a plurality of solder bumps which are not visible in FIG. 1, but will be in subsequent figures. The chip 20 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The package 10 may be lidless as depicted or fitted with any type of lid or heat spreader (not shown) as desired.

The substrate 15 may consist of a core/build-up configuration. In this regard, the substrate 15 may consist of a central core upon which one or more build-up layers are formed and below which an additional one or more build-up layers are formed. The core itself may consist of a stack of one or more layers. One example of such an arrangement may be termed a so called "2-4-2" arrangement where a four-layer core laminated between two sets of two build-up layers. The number of layers in the substrate 15 can vary from four to sixteen or more, although less than four may be used. So-called "coreless" designs may be used as well. The layers of the substrate 15 consist of an insulating material, such as various well-known epoxies, interspersed with metal interconnects.

To interface with other electronic devices, the substrate 15 may be configured as a ball grid array as shown, as a pin grid array, a land grid array or some other type of substrate interconnection scheme. A plurality of solder balls 25 are coupled to the substrate 15. A plurality of electrical interconnects are not visible in FIG. 1 but are incorporated into the substrate 15 in order to establish electrical interconnections between the chip 20 and the plurality of solder balls 25. The solder balls 25 may be composed of lead-free or lead-based solders. Examples include tin-silver, tin-copper, tin-silver-copper or the like.

The semiconductor chip 20 may be seated on an underfill material layer 27 that is interposed between the chip 20 and a solder mask 30 that is positioned on the substrate 15. The underfill layer 27 is designed to lessen the effects of the differing coefficients of thermal expansion of the chip 20 and the substrate 15. Well-known epoxy materials may be used, with or without glass or other fillers. A plurality of passive devices, a few of which are depicted and labeled 35a, 35b, 35c, 35d and 35e may be mounted on the solder mask 30 or at other locations on under or in the substrate 15 as desired. The passive devices 35a, 35b, 35c, 35d and 35e may be capacitors, inductors or other electronic components.

Figure 2:
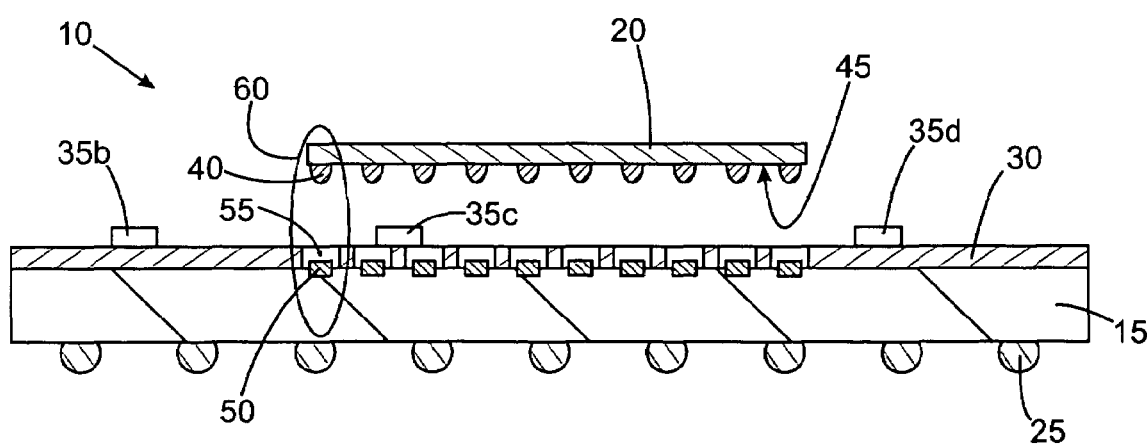
FIG. 2 is a sectional view of FIG. 1 taken at section 2-2.

Additional details of the package 10 may be understood by referring now also to FIG. 2, which is a sectional view of FIG. 1 taken at section 2-2. For clarity of illustration, the semiconductor chip 20 is shown exploded from the substrate 15 in FIG. 2 and without the underfill layer 27. Note also that because of the position of section 2-2, only the passive devices 35b, 35c and 35d are visible. As noted above, the semiconductor chip 20 is designed to be flip-chip mounted to the substrate 15. In this regard, the chip 20 is provided with a plurality of solder bumps, one of which is labeled 40, and the substrate 15 is provided with a plurality of conductor or bump pads, one of which is labeled 50. The following discussion of the interaction of the bump 40 and the pad 50 typifies the remainder of the package 10. The bump 40 and the pad 50 are designed to establish a metallurgical bond during a solder reflow process. Like the solder balls 25 depicted in FIGS. 1 and 2, the solder bump 40 may be composed of lead-free or lead-based solders. An exemplary lead-based solder may have a composition at or near eutectic proportions, such as about 63% lead and 37% tin. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The solder bump 40 may be formed on or coupled to the side 45 of the semiconductor chip 20 by a stencil print process followed by a reflow process at, for example, about 210 to 260° C. for about 10 seconds. To establish the requisite pre-reflow contact between the bump 40 and the pad 50, an opening 55 is provided in the solder mask 30 that exposes an upper portion of the pad 50. A portion of the package 10 is circumscribed by an oval 60 includes the ball 40, the pad 50 and the opening 55. The portion contained within the oval 60 will be shown at greater magnification in FIG. 3.

Figure 3:
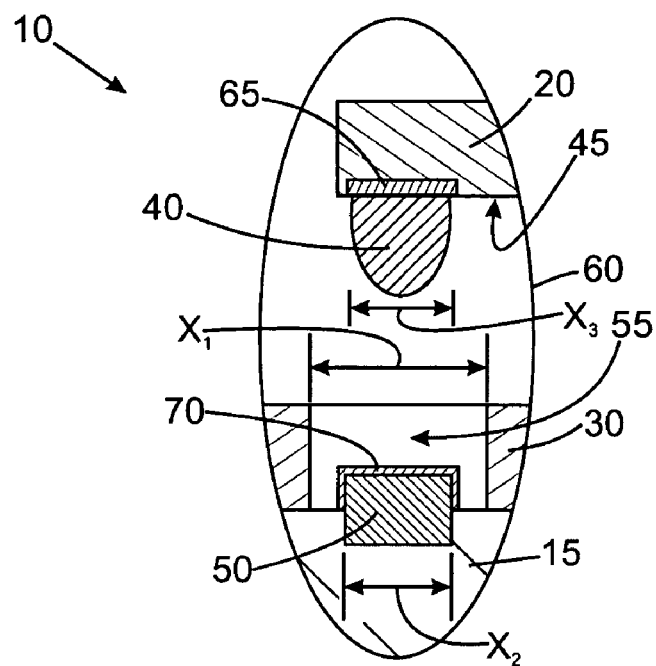
FIG. 3 is a magnified view of a portion of FIG. 2.

Attention is now turned to FIG. 3. The solder bump 40 of the semiconductor chip 20 is metallurgically bonded to a bump pad 65 positioned at the lower surface 45 of the chip 20. The structure of the bump pad 65 and the bump 40 typify the flip-chip interconnects for the remainder of the chip 20. Both the pad 65 of the chip 20 and the pad 50 of the substrate 15 may be composed of a variety of conducting materials, such as, for example, copper, silver, gold, platinum, palladium, combinations of these or the like. The bump pad 65 is interconnected with various active circuitry in the chip 20 by way of interconnect structures that are not visible in FIG. 3.

The solder mask 30 may be fabricated from a variety of suitable materials for solder mask fabrication, such as, for example, PSR-4000 AUS703 manufactured by Taiyo Ink Mfg. Co., Ltd. or SR7000 manufactured by Hitachi Chemical Co., Ltd. The opening 55 may be formed in the solder mask 30 by well-known lithography and etch processes. The opening 55 is formed in the solder mask 30 with a lateral dimension $X_1$ that is larger than the lateral dimension $X_2$ of the bump pad 50. The dimension of $X_1$ is also selected to be larger than the lateral dimension $X_3$ of the bump 40. In this way, the opening 55 can easily accommodate the bump 40 during mounting even if there are slight lateral misalignments between the bump 40 and the pad 50. This ease of accommodation is useful since the package 10 does not utilize an intervening conductor structure, such as a pre-solder, in order to establish a metallurgical connection between the bump 40 of the chip 20 and the pad 50 of the substrate 15. Because a pre-solder is not used, it is desirable to provide a solderable coating 70 on the pad 50 to prevent oxidation and/or other contamination of the pad 50 prior to the metallurgical bonding of the bump 40 thereto. In this regard, the coating 70 may be fabricated from materials such as tin, indium, antimony, gold, nickel, combinations or laminates of these or the like. Immersion coating or other application techniques may be used. Organic surface protection coatings may also be used to temporarily protect the pad 50 as long as such coatings volatilize sufficiently during reflow so that the solder bump 40 wets to the pad 50. An example of a suitable organic surface protection material is WPF207 supplied by Tamura Corporation. It should be understood that one or more electrical interconnects or traces (not visible) may be coupled to the bump pad 50 in the substrate 15 that are designed to electrically interconnect the pad 50 with other structures in the substrate 15, such as any of the ball grid array balls 25 depicted in FIGS. 1 and 2.

Figure 4:
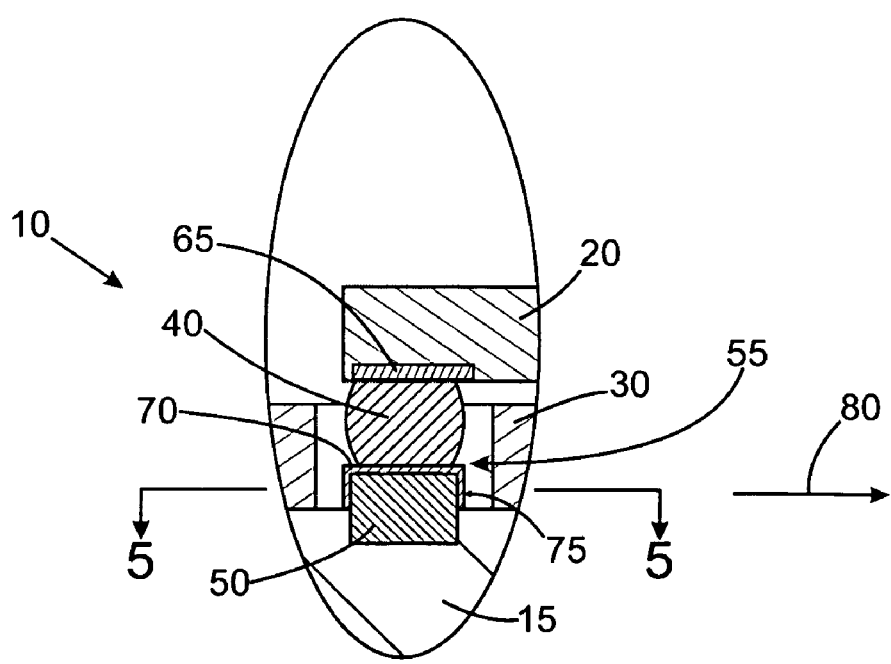
FIG. 4 is a magnified view of a portion of FIG. 2 following a solder reflow process.

Attention is now turned to FIG. 4, which is a sectional view like FIG. 3, but depicts the mounting of the chip 20 to the substrate 15 and the reflow in order to establish the metallurgical bonding between the bump 40 and the bump pad 50. A flux of well-known character (not shown) is applied to the bump pad 50 and the package 10 is heated to some temperature higher than the melting point of the bump 40 after initial contact with the bump pad 50. The bump 40 will tend to spread laterally as it wets the bump pad 65 of the chip 20 and the coating 70 of the bump pad 50 in the substrate 15. Depending upon the size of the bump 40 and the wettability of the coating layer 70, portions of the liquified bump 40 may actually proceed down the lateral wall 75 of the layer 70 and fill the opening 55. At this stage, an underfill material, such as the material 27 depicted in FIG. 1, may be applied between the chip 20 and the substrate 15. The underfill will likely fill any remaining void space in the opening 55.

Figure 5:
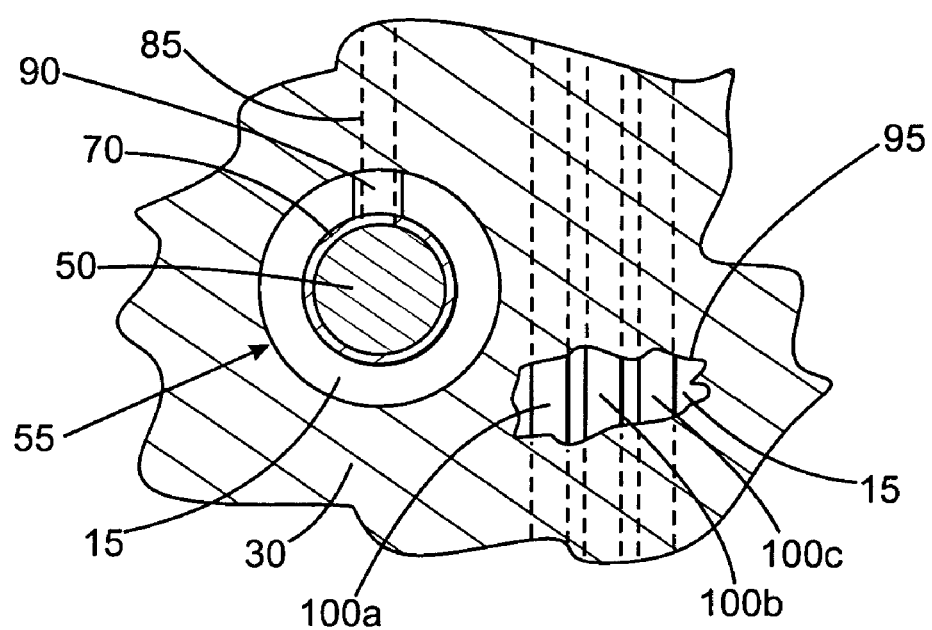
FIG. 5 is a sectional view of FIG. 4 taken at section 5-5.

Still further details of the bump pad 50 and the substrate 15 may be understood by referring to FIG. 5, which is a sectional view of FIG. 4 taken at section 5-5. Before proceeding to FIG. 5 in earnest, it will be useful to note that section 5-5 of FIG. 4 passes through the bump 50, the coating layer 70, and the solder mask 30, but not the bump 40 or the substrate 15. It should also be understood that FIG. 5 depicts small portions of the solder mask 30 and the substrate 15 that are lateral to the opening 55 in the general direction of the arrow 80 but not visible in FIG. 4. With that backdrop, attention is now turned to FIG. 5. As noted above, one or more electrical conductors or traces are connected to the bump pad 50. In this illustrative embodiment, a single trace 85 is shown in phantom and connected to the bump pad 50. The conductor 85 is shown in phantom due to the presence of the overlying solder mask 30. The conductor trace 85 may be composed of a variety of conducting materials, such as, for example, copper, silver, gold, platinum, palladium, combinations of these or the like. Note that because the opening 55 in the solder mask 30 extends far enough away from the bump 50, a small portion 90 of the conductor trace 85 will be coated with the same material as the layer 70 during the process to form the layer 70. A portion 95 of the solder mask 30 is cut away to reveal portions of a few other conductor traces 100a, 100b and 100c in the substrate 15. The remainders of the traces 100a, 100b and 100c depicted in FIG. 5 are shown in phantom. The traces 100a, 100b and 100c may be formed from the same materials used to form the trace 85. It should be understood that there may be scores or hundreds or more of such traces 100a, 100b and 100c in the substrate 15. In this illustrative embodiment, the bump pad 50 has a circular footprint. However the skilled artisan will appreciate that other shapes may be used, such as a rectangular, square or other shapes.

Figure 6:
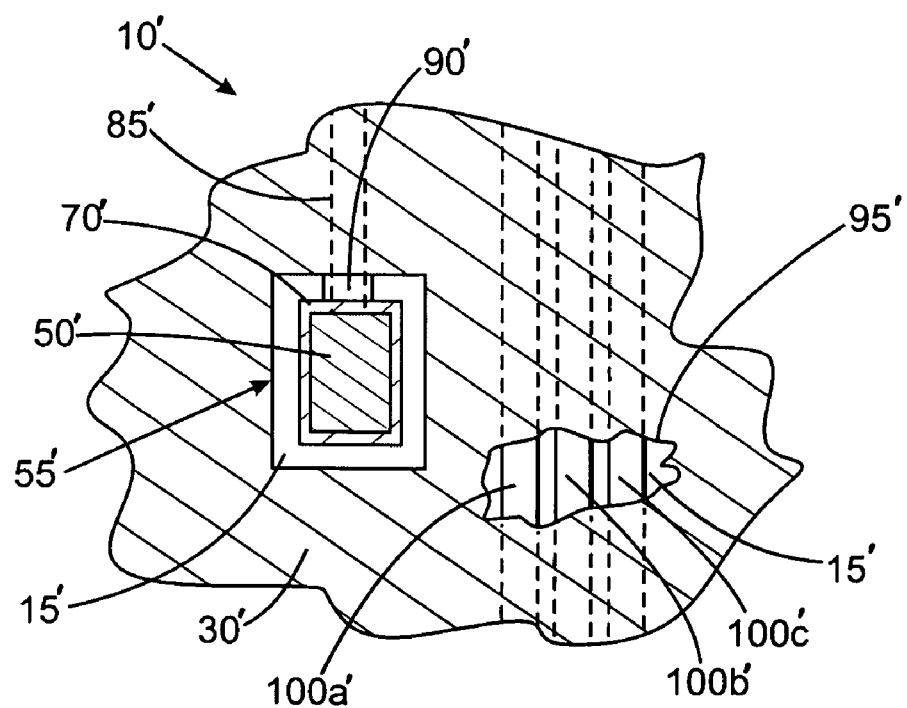
FIG. 6 is a sectional view like FIG. 5, but of an alternate exemplary embodiment of a semiconductor chip package.

An alternate exemplary embodiment of a package 10' may be understood by referring now to FIG. 6, which is a sectional view like FIG. 5, but depicts a substrate 15' upon which a solder mask 30' is formed that surrounds a rectangular bump pad 50'. A rectangular opening 55' is formed in the solder mask 30' to expose the bump pad 50'. The bump pad 50' may be provided with a correspondingly rectangular coating layer 70'. The opening 55' is patterned with a larger footprint than the combined footprint of the bump pad 50' and the coating layer 70' thereof. A conductor trace 85', shown in phantom due to the presence of the overlying solder mask 30', is connected to the bump pad 50'. Note that because the opening 55' in the solder mask 30' extends far enough away from the bump pad 50', a small portion 90' of the conductor trace 85' will be coated with the same material as the layer 70' during the process to form the layer 70'. A portion 95' of the solder mask 30' is cut away to reveal portions of a few other conductor traces 100a', 10b' and 100c' in the substrate 15'. The remainders of the traces 100a', 10b' and 100c' depicted in FIG. 6 are shown in phantom. The same materials and processing techniques described elsewhere herein may be used in conjunction with the package 10'. A rectangular footprint for the bump pad 50' can provide for tighter spacing between adjacent pads and the traces 100a', 10b' and 100c' than a comparably sized circular pad.

Figure 7:
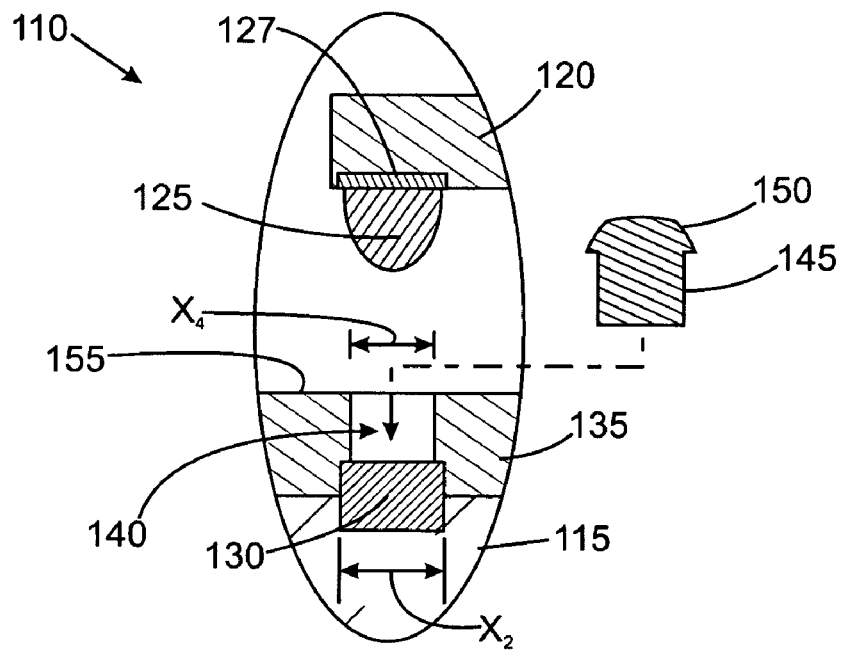
FIG. 7 is sectional view like FIG. 3, but of a conventional semiconductor chip-to-package substrate bump interface.

It may be useful at this point to contrast the exemplary embodiments depicted in FIGS. 1-6 with a conventional solder bump. FIG. 7 is a sectional view like FIG. 3 but of a conventional package 110 that includes a substrate 115 that is designed to receive a semiconductor chip 120 that has a plurality of solder bumps connected to corresponding bump pads. One example of the solder bumps is shown and labeled 125 and one example of the pads is shown and labeled 127. The substrate 115 is provided with a plurality of bump pads, one of which is shown and labeled 130. A solder mask 135 is formed on the substrate 115 with an opening 140 leading to the bump pad 130. For this illustration, the bump pad 130 may have the same lateral dimension $X_2$ as the bump pad 50 in the substrate 15 depicted in FIGS. 3 and 4. However, the opening 140 in FIG. 7 is customarily formed with a lateral dimension $X_4$ that is smaller than the lateral dimension $X_2$. The opening 140 is designed to have a pre-solder 145 formed therein with a crown portion 150 projecting slightly above the upper surface 155 of the solder mask 135. The pre-solder 145 is formed in the opening 130 by a multi-step process that involves the initial deposition of solder through a stencil (not shown) and into the opening 140. The pre-solder 145 is reflowed at, for example, about 210 to 260° C. for about 10 seconds and then coined by a die (not shown) that reduces the vertical lateral dimension of a crown portion 150 of the pre-solder 145 while slightly increasing the lateral dimension thereof. Following the coining process, the substrate 115 is ready to mount the chip 120 thereto.

Figure 8:
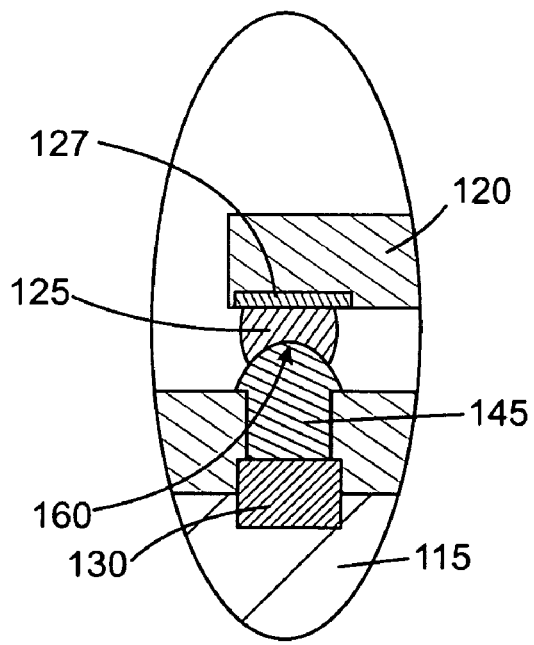
FIG. 8 is sectional view like FIG. 7 following a solder reflow process.

The aftermath of the formation of the pre-solder 145 in the solder mask 135, and the chip mounting and solder reflow processes is depicted in FIG. 8. The bump 125 and the pre-solder 145 merge metallurgically during the reflow to establish the requisite electrical pathway between the bump pad 127 of the chip 120 and the underlying bump pad 130 of the substrate 115. An interface 160 between the pre-solder 145 and the bump 125 is depicted in a schematic sense and for continuity of depiction purposes only, since in reality the interface will not be discernable. In short, the conventional process using a pre-solder requires the steps of solder stencil placement, solder deposition, solder stencil removal and coining, all of which are eliminated via the exemplary embodiments of FIGS. 1-6.

Figure 9:
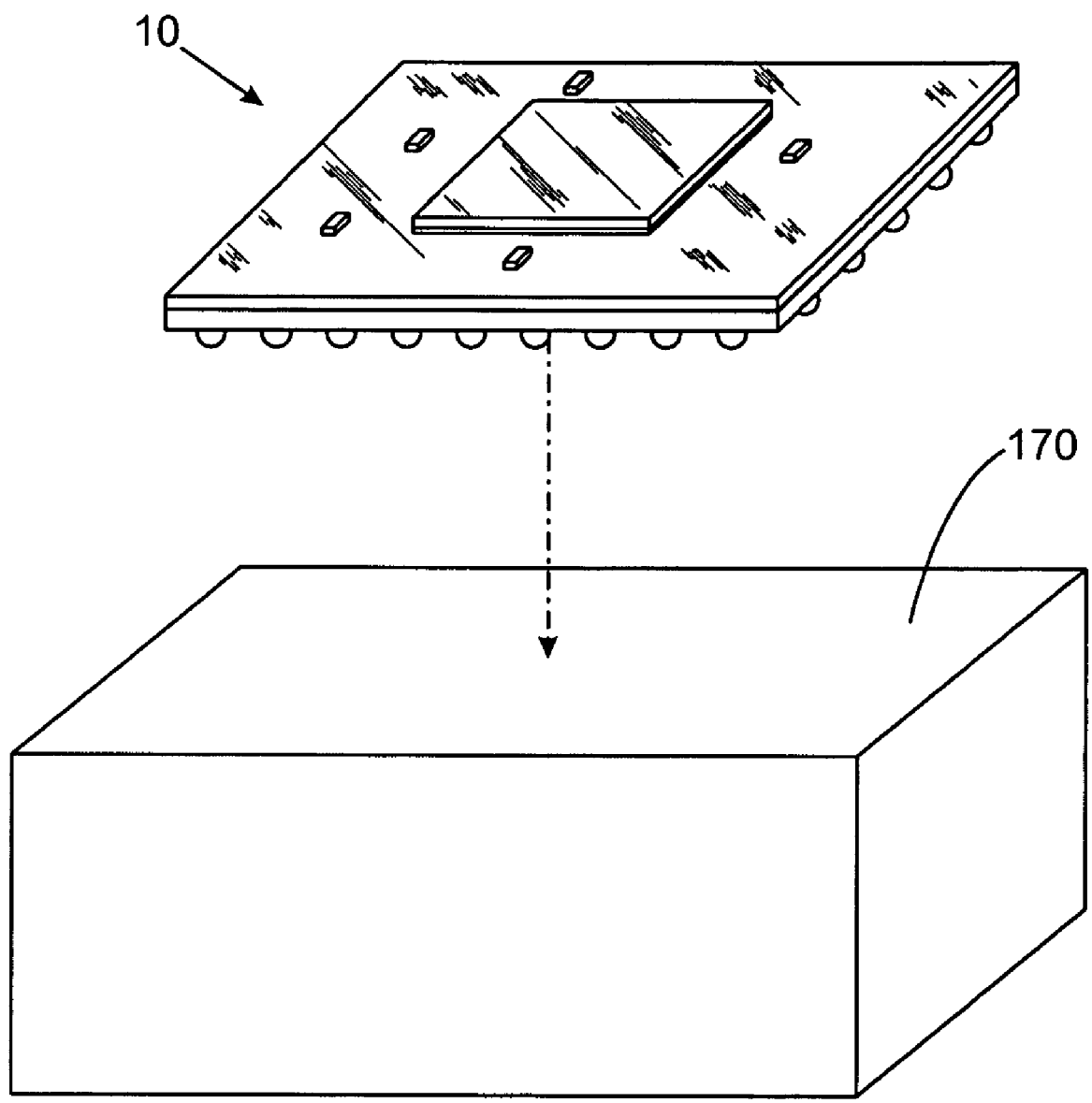
FIG. 9 is a pictorial view of an exemplary semiconductor chip package coupled to another electronic device.

Any of the illustrative embodiments of the chip packages disclosed herein may be mounted in another electronic device. In this regard, FIG. 9 shows an exemplary electronic device 170 that may be a computer, a digital television, a handheld mobile device, a personal computer, a server, a memory device, an add-in board such as a graphics card, or any other computing device employing semiconductors. The semiconductor chip package 10 may be attached to the device 170 to provide a desired functionality.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   coupling a solder bump to a side of a semiconductor chip;
   bringing the solder bump into contact with a conductor pad coupled to a substrate and positioned in an opening of a solder mask on the substrate, the conductor pad having a first lateral dimension and the opening having a second lateral dimension larger than the first lateral dimension; and
   establishing a metallurgical bond between the solder bump and the conductor pad.

2. The method of claim 1, wherein the coupling a solder bump comprises stencil printing a solder bump and thereafter reflowing the solder bump.

3. The method of claim 1, comprising forming a solderable coating on the conductor pad prior to bringing the solder bump into contact therewith.

4. The method of claim 3, wherein the solderable coating comprises tin and the solder bump comprises a lead-free solder.

5. The method of claim 1, wherein the establishing a metallurgical bond comprises reflowing the solder bump.

6. The method of claim 1, comprising coupling the substrate to an electronic device.

7. A method of manufacturing, comprising:
   forming plural conductor pads on a package substrate, each of the conductor pads having a first lateral dimension;
   forming a solder mask on the package substrate with plural openings exposing upper portions of each of the plural conductor pads, each of the plural openings having a second lateral dimension being larger than the first lateral dimension;
   coupling plural solder bumps to a side of a semiconductor chip;
   bringing each of the plural solder bumps into contact with a corresponding conductor pad; and
   establishing a metallurgical bond between each of the plural solder bumps and each of the corresponding plural conductor pads.

8. The method of claim 7, wherein the coupling the plural solder bumps comprises stencil printing plural solder bumps and thereafter reflowing the plural solder bumps.

9. The method of claim 7, comprising forming a solderable coating on the plural conductor pads prior to bringing the plural solder bumps into contact therewith.

10. The method of claim 9, wherein the solderable coating comprises tin and the plural solder bumps comprise a lead-free solder.

11. The method of claim 7, wherein the establishing a metallurgical bond comprises reflowing the plural solder bumps.

12. The method of claim 7, comprising coupling the package substrate to an electronic device.

13. The method of claim of claim 7, wherein the forming a solder mask comprises applying a solder mask material and etching the plural openings.

14. A method of manufacturing, comprising:
    coupling a solder bump to a side of a semiconductor chip;
    bringing the solder bump into contact with a rectangular conductor pad coupled to a substrate and positioned in a rectangular opening of a solder mask on the substrate, the rectangular conductor pad having a first lateral dimension and the rectangular opening having a second lateral dimension larger than the first lateral dimension; and
    establishing a metallurgical bond between the solder bump and the rectangular conductor pad.

15. The method of claim 14, comprising forming a solderable coating on the rectangular conductor pad prior to bringing the solder bump into contact therewith.

16. The method of claim 15, wherein the solderable coating comprises tin and the solder bump comprises a lead-free solder.

* * * * *